United States Patent [19]
Schöniger et al.

[11] Patent Number: 6,101,141
[45] Date of Patent: Aug. 8, 2000

[54] INTEGRATED MEMORY

[75] Inventors: Sabine Schöniger; Peter Schrögmeier; Thomas Hein, all of München; Stefan Dietrich, Türkenfeld; Thilo Marx, München, all of Germany

[73] Assignee: Siemens Aktiengesellschaft, Munich, Germany

[21] Appl. No.: 09/344,922

[22] Filed: Jun. 28, 1999

[30] Foreign Application Priority Data

Jun. 26, 1998 [DE] Germany ............................ 198 28 657

[51] Int. Cl.$^7$ ........................................ G11C 7/02
[52] U.S. Cl. ...................... 365/207; 365/203; 365/189.02
[58] Field of Search .................................. 365/207, 205, 365/203, 189.02

[56] References Cited

U.S. PATENT DOCUMENTS

| | | |
|---|---|---|
| 5,015,891 | 5/1991 | Choi . |
| 5,160,861 | 11/1992 | Lee . |
| 5,283,760 | 2/1994 | Chin et al. . |
| 5,502,684 | 3/1996 | Koshikawa et al. ................ 365/203 X |
| 5,539,700 | 7/1996 | Kawahara et al. ................ 365/205 X |
| 5,574,687 | 11/1996 | Nakase ............................... 365/203 X |
| 5,710,737 | 1/1998 | Komiya et al. . |

FOREIGN PATENT DOCUMENTS 0 591 850 A2  4/1994  European Pat. Off. .

*Primary Examiner*—Huan Hoang
*Attorney, Agent, or Firm*—Herbert L. Lerner; Laurence A. Greenberg; Werner H. Stemer

[57] ABSTRACT

The integrated memory has a data line pair, which is connected to a bit line pair via at least one differential amplifier. In addition, it has a control unit for setting first potential states on the data line pair which correspond to the differential signals of data to be written to the memory cells, and for setting at least one second potential state on the data line pair which does not correspond to any datum to be written to the memory cells. Furthermore, it has a detector unit having two inputs connected to the data line pair. The detector unit initiates a specific control function when the second potential state of the data line pair occurs.

1 Claim, 3 Drawing Sheets

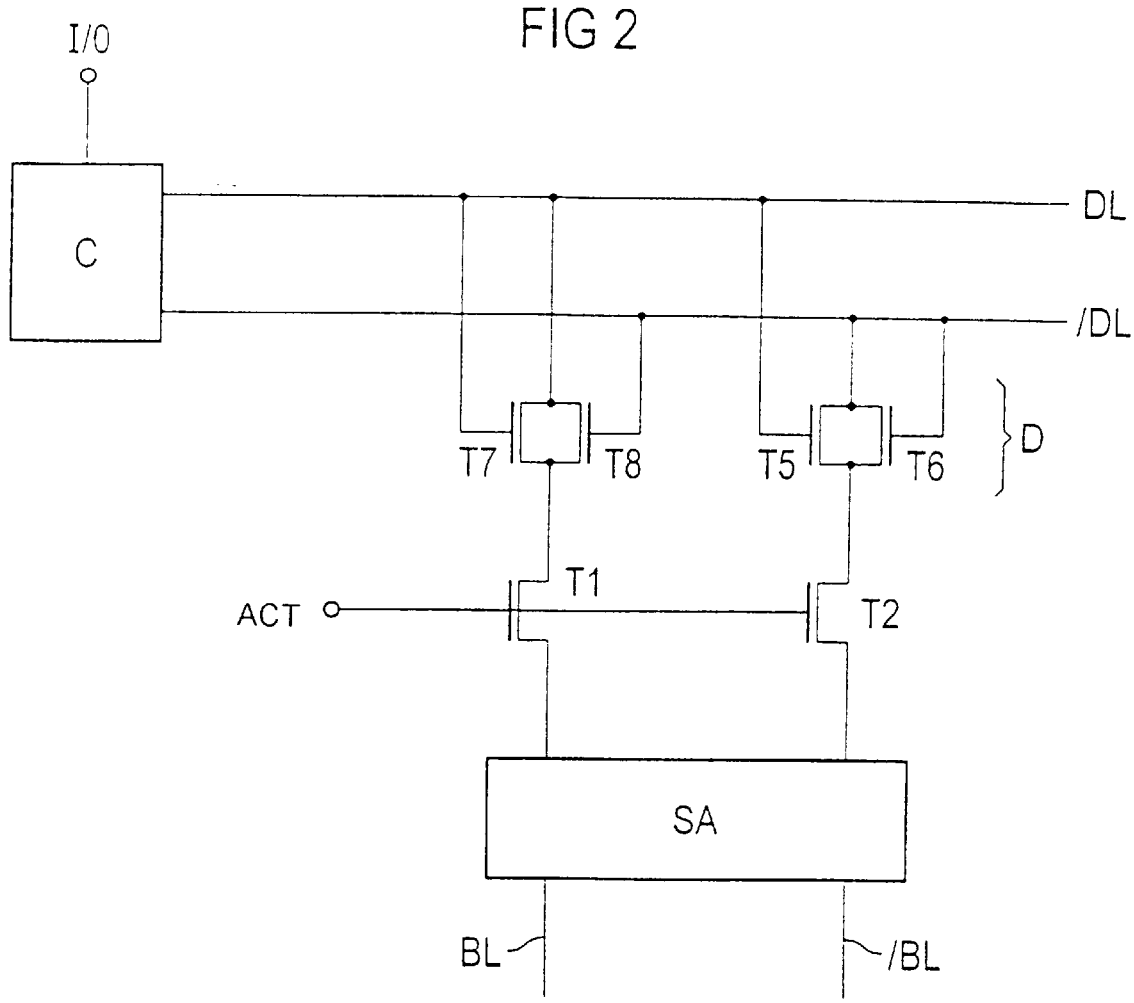

INTEGRATED MEMORY

BACKGROUND OF THE INVENTION

1. Field of the Invention

The invention relates to an integrated memory having a data line pair, which is connected to a bit line pair via at least one differential amplifier, data being transferred in the form of differential signals from the data line pair via the differential amplifier to the bit line pair and from there into memory cells connected thereto.

A memory of that type in the form of a DRAM is described by Betty Prince in "Semiconductor Memories—a Handbook of Design, Manufacture and Application," 2nd Ed., John Wiley and Sons, West Sussex, 1996, p. 258 (see FIG. 6.26a). The differential amplifier is a read/write amplifier, that is to say data can be transferred in both directions between the data line pair and the bit line pair. Only a write operation of the DRAM shall be considered in the following text. If a logic "1" is intended to be written to one of the memory cells, one line of the data line pair is brought to a high potential and the other line to a low potential. If a logic "0" is intended to be written, the potential on the two lines are interchanged relative to this.

It is customary for the two lines of the data line pair to be recharged to the same potential prior to the reading of a memory cell in a read operation (so-called precharging). By way of example, both lines of the data line pair may be brought to a high potential for this purpose. In the course of the subsequent reading of a memory cell, the content thereof influences the precharged potential on the data line pair via the bit lines and the read/write amplifier.

2. Summary of the Invention

It is accordingly an object of the invention to provide a integrated memory device, which overcomes the above-mentioned disadvantages of the heretofore-known devices and methods of this general type and which allows enables controlling its functions over greater distances without requiring special control lines.

With the foregoing and other objects in view there is provided, in accordance with the invention, an integrated memory, comprising:

- a data line pair, a bit line pair, and at least one differential amplifier connected between the data line pair and the bit line pair;
- memory cells connected to the bit line pair for receiving data in differential signal form from the data line pair via the differential amplifier and via the bit line pair;
- a control unit connected to the data line pair, the control unit:
  - setting first potential states on the data line pair corresponding to the differential signals of data to be written to the memory cells; and
  - setting at least one second potential state on the data line pair not corresponding to any datum to be written to the memory cells;
- a detector unit having two inputs connected to the data line pair, the detector unit initiating a specific control function on occurrence of the second potential state on the data line pair.

In other words, the novel integrated memory has a control unit which, on the one hand, serves for setting first potential states on the data line pair which correspond to the differential signals of data to be written to the memory cell and, on the other hand, serves for setting at least one second potential state on the data line pair which does not correspond to any datum to be written to the memory cells.

Furthermore, the memory has a detector unit having two inputs, each of which is connected to a line of the data line pair. The detector unit initiates the desired control function when the second potential state of the data line pair occurs.

While the first potential states therefore concern those which occur on the data line pair if data corresponding to these first potential states are transferred in the form of a resultant differential signal on the data line pair via the differential amplifier to one of the memory cells (for example, first line of the data line pair low potential, second line high potential during the writing of a logic "0", high potential on the first line and low potential on the second line during the writing of a logic "1"), the second potential state does not normally occur during a write operation. One example of the second potential state is the presence of a low potential on both lines of the data line pair. The detector unit identifies the presence of this second potential state and thereupon triggers the desired control function.

The invention affords the advantage that the data line pair which is necessary in any case for writing and reading, also serves, in addition to its usual function, for communicating the second potential state to the detector unit and thus for triggering the control function. It is not necessary, therefore, to provide an additional control line in the integrated memory for this purpose, which control line would require a considerable amount of space particularly in the case of relatively large distances to be bridged. In the case of the invention, the lines of the data line pair bridge the desired distance from the control unit to the detector unit that initiates the control function.

In accordance with an added feature of the invention, the detector unit deactivates the differential amplifier on occurrence of the second potential state, i.e., when the second potential state occurs on the data line pair. If the differential amplifier is a read/write amplifier, data read from a memory cell onto the associated bit lines are thereby prevented from passing unintentionally via the differential amplifier to the data lines. This is advantageous particularly when the data line pair is connected to a plurality of differential amplifiers, each of which is connected to corresponding memory cells via a respective bit line pair. All the differential amplifiers can then be deactivated simultaneously, given the presence of the second potential state on the data line pair, by means of a respective detector unit per differential amplifier, thereby avoiding the situation where a plurality of the differential amplifiers simultaneously output data unintentionally onto the data line pair and a short circuit can thus arise. In this case, the detector units can, in a favorable manner, be arranged in a decentralized fashion directly where the desired control function is to be executed. Directly at the respective differential amplifier, therefore, in the case outlined.

In accordance with an additional feature of the invention, two activation transistors are connected between a respective input of the differential amplifier and the first and second lines of the data line pair. The activation transistors have control terminals connected to the output of the detector unit so as to receive the output signal of the detector unit.

In accordance with another feature of the invention, two data lines of the data line pair are connected to a respective input of the differential amplifier via two respective activation transistors, and one transistor of each transistor pairs has a control input connected to each data line.

In accordance with a concomitant feature of the invention: the differential amplifier has a first operating mode in which data is forwarded from the data line pair to the bit line pair in a non-inverted state, and a second operating mode in which the data is forwarded in an inverted state; the detector unit switches the operating mode of the differential amplifier upon occurrence of the second potential state on the data line pair.

This embodiment is particularly suitable for application during a test mode of the integrated memory. This is because one and the same datum present on the data line pair can be written to the corresponding memory cell optionally in an inverted or non-inverted manner.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic diagram of a second exemplary embodiment of the invention;

FIG. 3 shows an associated logic table; and

DESCRIPTION OF THE PREFERRED EMBODIMENTS

Figure 1:
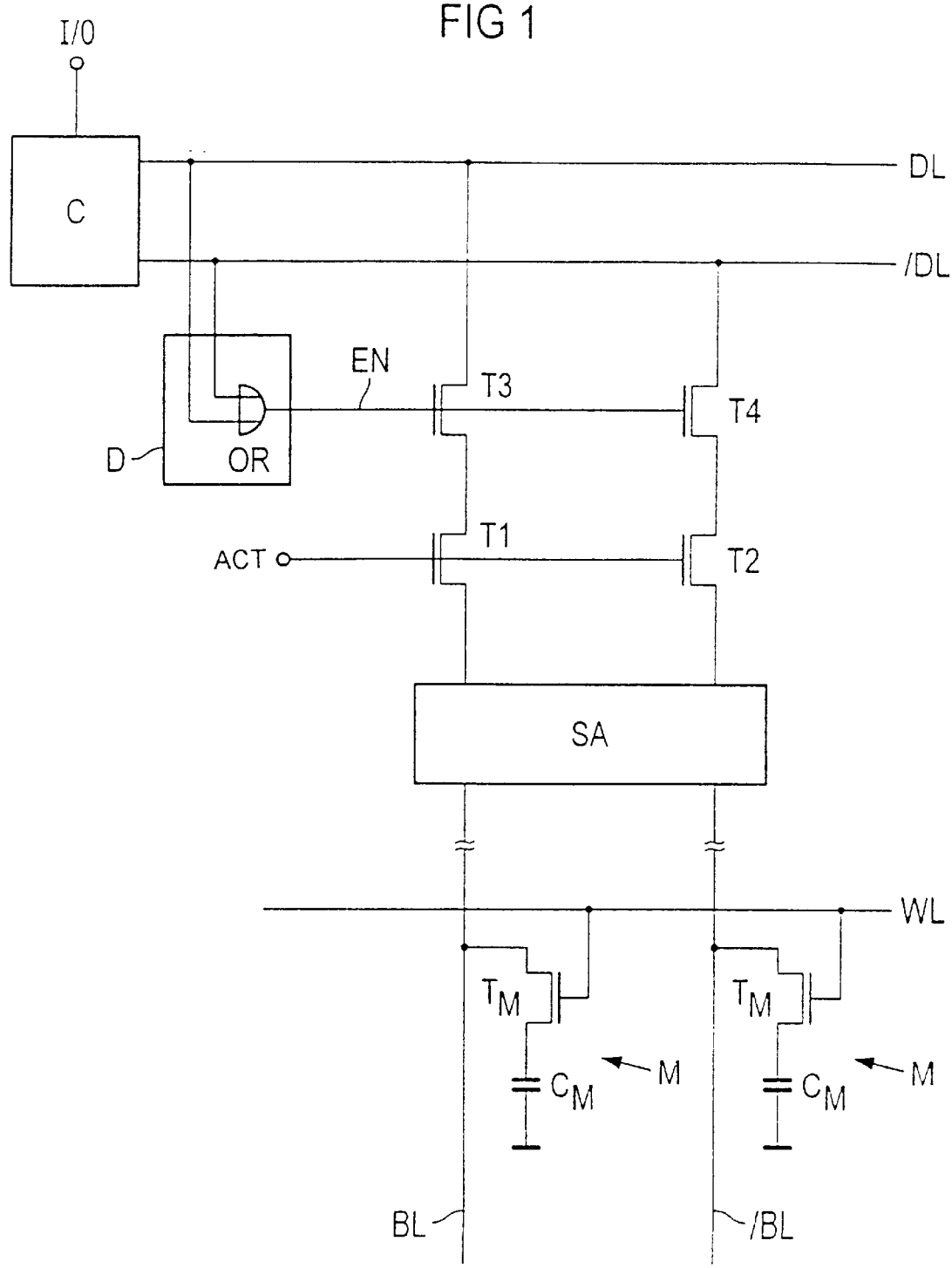
Fig. 1 is a schematic diagram of a first exemplary embodiment of the invention.

Referring now to the figures of the drawing in detail and first, particularly, to FIG. 1 thereof, there is seen a first exemplary embodiment of the integrated memory according to the invention, having a data line pair DL, /DL and a control unit C for setting the potential on the two lines of the data line pair. Furthermore, the memory in FIG. 1 has memory cells M, which are of the 1-transistor DRAM memory cell type in the present case. It should be understood, however, that the invention can also be applied to other memory types. Each of the memory cells M has a selection transistor TM and a storage capacitor CM. The gates of the control transistors TM are connected to word lines WL, only one of which is illustrated in FIG. 1. One electrode of the storage capacitor CM is connected to ground and the other electrode of the capacitor is connected to the source of the selection transistor TM, which is an n-channel transistor. The drain of the selection transistor TM is connected to a bit line BL, which is part of a bit line pair BL, /BL. A differential amplifier in the form of a read/write amplifier SA connects the data line pair to the bit line pair. The differential amplifier SA may be configured, for example, as described by Betty Prince in the above-mentioned "Semiconductor Memories."

The connecting lines between the data line pair DL, /DL have a first transistor T1 and a second transistor T2, respectively, whose gates are connected to an activation signal ACT. The activation signal ACT serves to decouple the data line pair from the differential amplifier SA. This will not be discussed any further at this point, however. Furthermore, a third transistor T3 and a fourth transistor T4 are respectively arranged between the data line pair and the differential amplifier SA, with the result that the first line DL of the data line pair is connected to one terminal of the differential amplifier SA via a series circuit formed by the third transistor T3 and the first transistor T1, and the second line /DL of the data line pair is connected to a second terminal of the differential amplifier via a series circuit formed by the fourth transistor T4 and the second transistor T2.

The integrated memory illustrated in FIG. 1 furthermore has a detector unit D having two inputs connected to a respective one of the lines of the data line pair DL, /DL. The detector unit D contains an OR gate OR, whose inputs are connected to the inputs of the detector unit D. An output of the OR gate OR is connected to the gates of the third T3 and of the fourth T4 transistor. An enable signal EN is established at the output of the OR gate OR.

The fundamental operation of all of the exemplary embodiments explained here shall be clarified below with reference to FIG. 3. FIG. 3 shows the respective potential states of the data line pair DL, /DL for various functions to be executed. In this case, the numerals in FIG. 3 designate logic states, a "1" corresponding to a high level ($V_{cc}$) and a "0" corresponding to a low level (ground). FIG. 3 reveals that when a logic "0" is written to a memory cell M of the memory, the first line DL of the data line pair has a low level and the second line /DL has a high level. The situation is exactly the opposite when a logic "1" is written. The potential states of the data line pair are in this case determined by the control unit C. For this purpose, the control unit C (see FIG. 1) is connected to terminals I/O, to which the data to be written can be applied, whereupon the control unit generates the corresponding potential states on the data line pair. During a read operation, the control unit C charges the two lines of the data line pair to a high level (see FIG. 3). This corresponds to precharging the data line pair. A datum subsequently transferred from one of the memory cells M via the bit line pair and the differential amplifier SA to the data line pair leads to the discharging of one of the two lines of the data line pair DL, /DL. The control unit C identifies which data line has been discharged and concludes from this whether a read logic "0" or a logic "1" is involved. The datum determined in this way is output by the control unit C to the terminal I/O.

In accordance with FIG. 3, there is another further potential state which is likewise set by the control unit C. In the case of this fourth potential state, the two lines of the data line pair DL, /DL have a low level. This potential state serves for the triggering of a control function by the detector unit D. The exemplary embodiments that are dealt with here relate to different ways of evaluating the last-mentioned potential state of the data line pair and also the resultant control function.

Referring once more to FIG. 1, it is evident that when the potential states of the data line pair which are listed in the first three lines of the table in FIG. 3 occur at the output of the detector unit D, the enable signal EN always has a high level. Accordingly, the third transistor T3 and the fourth transistor T4 are switched on. The consequence of this is that the differential amplifier SA is able to function in these cases, provided that the activation signal ACT likewise has a high level. If, however, both lines of the data line pair DL, /DL in FIG. 1 are discharged, that is to say they have a low level (ground), the enable signal EN also has a low level and the third and fourth transistors are turned off. In other words, if the potential state of the data line pair which is specified in the last line of the table in FIG. 3 occurs in FIG. 1, the differential amplifier SA is decoupled from the data line pair irrespective of the state of the activation signal ACT and is thus deactivated.

It is advantageous, in accordance with the invention, for the deactivation of the differential amplifiers to be performed in a controlled manner by means of the data line pair which is present in any case, instead of a separate enable line being routed parallel to the data line pair. The saving of an additional control line results in a significant advantage in terms of area.

Although the data line pair DL, /DL is connected to just one differential amplifier SA and a corresponding bit line pair BL, /BL in FIG. 1, in reality a multiplicity of differential amplifiers SA and corresponding bit line pairs are connected to the same data line pair. Since these are distributed over a large area in the integrated memory, each of the differential amplifiers SA is advantageously connected to the data line pair and provided with a corresponding detector unit D in the manner shown in FIG. 1. All the differential amplifiers can then be activated and deactivated via the data line pair without the necessity of an additional control line.

Referring now to FIG. 2, there is shown a second exemplary embodiment of the invention which differs from that of FIG. 1 only in the following way: the fourth transistor T4 has been replaced by a fifth transistor T5 and a sixth transistor T6 of the n-channel type, whose channel paths are connected in parallel with one another and are arranged between the second data line /DL and the second transistor T2. The third transistor T3 from FIG. 1 has been replaced by a seventh transistor T7 and an eighth transistor T8, whose channel paths are likewise arranged in parallel with one another and between the first data line DL and the first transistor T1. The gates of the seventh transistor T7 and fifth transistor T5 are connected to the first data line DL. The gates of the eighth transistor T8 and sixth transistor T6 are connected to the second date line /DL.

The method of operation of the exemplary embodiment of FIG. 2 is as follows: in the case of the potential states of the data line pair which are entered in the first three lines in the table of FIG. 3, at least either the seventh transistor T7 or the eighth transistor T8 is in the ON state. Likewise, at least the fifth transistor T5 or the sixth transistor T6 is always in the ON state. The differential amplifier is thus activated since it can transfer data from and to the data lines (provided that the first transistor T1 and the second transistor T2 are also switched on). If, on the other hand, the two lines of the data line pair DL, /DL have a low level (ground), all four transistors T5 to T8 are turned off and the differential amplifier SA is disconnected from the data line pair DL, /DL irrespective of the activation signal ACT and is thus deactivated. Therefore, just like the detector unit from FIG. 1, the detector unit D realized by the four transistors T5 to T8 effects deactivation of the differential amplifier SA if the two lines of the data line pair have low potential.

Figure 4:
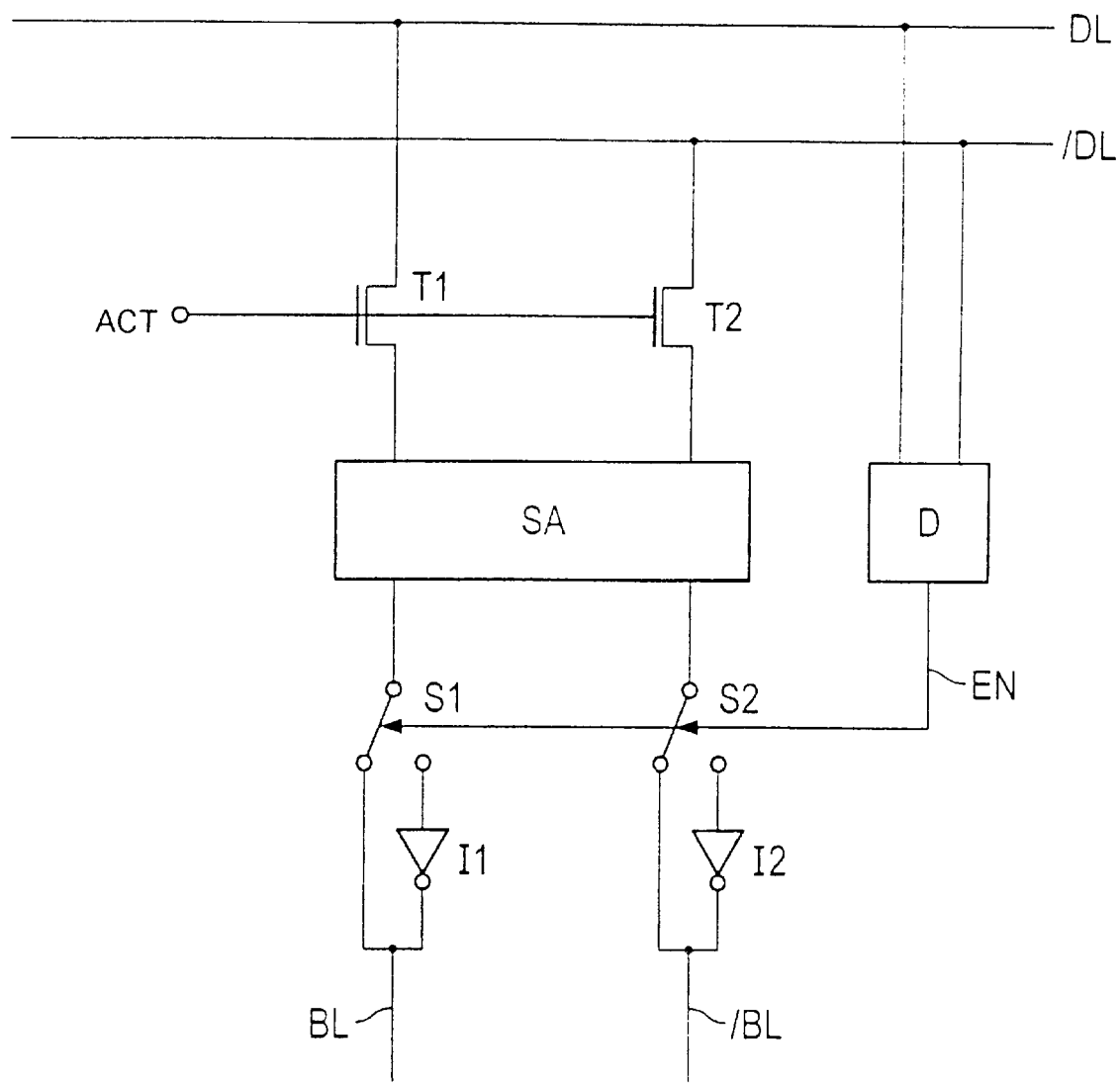
FIG. 4 is a schematic diagram of a third exemplary embodiment of the invention.

FIG. 4 shows a third exemplary embodiment of the invention, in which the differential amplifier SA forwards data situated on the data line pair DL, /DL to the bit line pair BL, /BL in a non-inverted manner in a first operating mode and in an inverted manner in a second operating mode. For this purpose, the differential amplifier SA is connected, by means of a first switching element S1, to the first bit line BL directly in the first operating mode and to the first bit line BL via a first inverter I1 in the second operating mode. Likewise, the differential amplifier SA is connected, by means of a second switching element, to the second bit line /BL directly in the first operating mode and to the second bit line /BL via a second inverter I2 in the second operating mode. The switching position of the two switching elements S1, S2, which may be realized by multiplexers for example, is defined by the enable signal EN generated by the detector unit D at its output. The detector unit D is designed such that it alters the switch position of the two switching elements S1, S2 whenever the two lines of the data line pair DL, /DL have a low level, and thus triggers a change in the operating mode of the differential amplifier. For this purpose, the detector unit D may contain a changeover flip-flop, for example, whose output supplies the enable signal EN and whose input is connected to the two lines of the data line pair DL, /DL via a NAND gate. The NAND gate supplies a high level at its output whenever low potential is present on both lines of the data line pair. In the event of every positive edge at its input, the changeover flip-flop changes the level of its output signal, which is identical to the enable signal EN.

What is claimed is:

1. An integrated memory, comprising:

a data line pair, a bit line pair, and at least one differential amplifier connected between said data line pair and said bit line pair, said at least one differential amplifier having a first operating mode in which data is forwarded from said data line pair to said bit line pair non-inverted, and a second operating mode in which the data is forwarded inverted;

memory cells connected to said bit line pair for receiving data in differential signal form from said data line pair via said differential amplifier and via said bit line pair;

a control unit connected to said data line pair, said control unit:

setting first potential states on said data line pair corresponding to the differential signals of data to be written to said memory cells; and setting at least one second potential state on said data line pair not corresponding to any datum to be written to the memory cells;

a detector unit having two inputs connected to said data line pair, said detector unit initiating a specific control function on occurrence of the second potential state on said data line pair and switching the operating mode of said differential amplifier upon occurrence of the second potential state on said data line pair.

* * * * *